United States Patent
Hansen et al.

(10) Patent No.: US 9,706,302 B2
(45) Date of Patent: Jul. 11, 2017

(54) LOUDSPEAKER SYSTEM COMPRISING EQUALIZATION DEPENDENT ON VOLUME CONTROL

(71) Applicant: Sennheiser Communications A/S, Ballerup (DK)

(72) Inventors: Anders Røser Hansen, Ballerup (DK); Poul Peder Hestbek, Smørum (DK)

(73) Assignee: SENNHEISER COMMUNICATIONS A/S, Ballerup (DK)

( * ) Notice: Subject to any disclaimer, the term of this patent is extended or adjusted under 35 U.S.C. 154(b) by 255 days.

(21) Appl. No.: 14/173,651

(22) Filed: Feb. 5, 2014

(65) Prior Publication Data

US 2015/0222990 A1 Aug. 6, 2015

(51) Int. Cl.
*H04R 3/04* (2006.01)
*H03G 5/00* (2006.01)
(Continued)

(52) U.S. Cl.
CPC ............... *H04R 3/04* (2013.01); *H03G 5/005* (2013.01); *H03G 5/165* (2013.01); *H03G 9/025* (2013.01); *H04R 2430/01* (2013.01)

(58) Field of Classification Search
CPC ........ H03G 5/005; H03G 5/165; H03G 9/025; H03G 5/025; H03G 3/32; H03G 3/00; H04S 7/307; H04R 3/04; H04R 2430/01
(Continued)

(56) References Cited

U.S. PATENT DOCUMENTS 4,327,250 A 4/1982 Von Recklinghausen
5,708,722 A * 1/1998 Forgues ............... H03G 7/005
381/104
(Continued)

FOREIGN PATENT DOCUMENTS

JP   2007-158614 A   6/2007
JP   2010-288113 A   12/2010
WO   WO 93/18626 A1   9/1993

*Primary Examiner* — Davetta W Goins
*Assistant Examiner* — Oyesola C Ojo
(74) *Attorney, Agent, or Firm* — Birch, Stewart, Kolasch & Birch, LLP

(57) ABSTRACT

The application relates to a loudspeaker system including an input unit providing an electric input audio signal; an equalization unit for modifying said electric input audio signal in dependence on frequency and to provide an equalized electric audio signal according to a predefined equalization function, a loudspeaker unit for converting said equalized electric audio signal to an acoustic output sound signal, and a user interface for modifying a volume level of said output sound signal in a multitude (N) of steps $V_0$, $V_1, \ldots, V_N$. The application further relates to a method communication device comprising the loudspeaker system and to its use. The present application provides an improved loudspeaker system in which the equalization unit is configured to apply a specific equalization function $EQ_0$, $EQ_1, \ldots, EQ_N$ to the electric input audio signal in each of said multitude of steps $V_0, V_1, \ldots, V_N$ of the volume level.

17 Claims, 8 Drawing Sheets

(51) Int. Cl.
*H03G 5/16* (2006.01)
*H03G 9/02* (2006.01)

(58) Field of Classification Search
USPC .......... 381/103, 102, 107, 105, 109, 98, 111
See application file for complete search history.

(56) References Cited

U.S. PATENT DOCUMENTS

| | | |
|---|---|---|
| 2002/0076072 A1 | 6/2002 | Cornelisse |
| 2005/0026565 A1* | 2/2005 | Goldstein ........... H04L 27/2657 455/67.11 |
| 2007/0098188 A1 | 5/2007 | Felder |
| 2007/0223736 A1* | 9/2007 | Stenmark ............... H03G 5/005 381/103 |
| 2008/0170723 A1* | 7/2008 | Sakagami .............. H03G 9/025 381/103 |
| 2009/0174823 A1* | 7/2009 | Knutson ................. H04S 7/307 348/738 |
| 2012/0215530 A1* | 8/2012 | Harsch ................... H04R 27/00 704/225 |
| 2013/0022208 A1* | 1/2013 | Dhuyvetter .......... H03G 11/002 381/55 |

* cited by examiner

LOUDSPEAKER SYSTEM COMPRISING EQUALIZATION DEPENDENT ON VOLUME CONTROL

TECHNICAL FIELD

The present application relates to loudspeaker systems, e.g. such systems that work under power constraints. The disclosure relates specifically to a loudspeaker system comprising a loudspeaker unit, an equalization unit, and a user interface.

The application furthermore relates to a communication device comprising the loudspeaker system and to the use of the loudspeaker system.

Embodiments of the disclosure may e.g. be useful in applications such as handsfree telephone systems, mobile telephones, teleconferencing systems (e.g. speakerphones), public address systems, karaoke systems, classroom amplification systems, etc.

BACKGROUND

Typically, a loudspeaker unit exhibits a low frequency fall-off in its frequency transfer function. In audio systems, it is known to boost low frequencies by having the option of applying a fixed dedicated 'extra gain' at low frequencies ('Loudness' button). WO9318626A1 describes dynamic adjustment of low frequency gain, where the applied gain is dependent on the content (magnitude) of signal components at low frequencies in the current signal.

SUMMARY

The present application presents an alternative strategy for improving sound reproduction of a broadband signal at low frequencies or at other frequencies where a loudspeaker unit exhibits deficiencies (e.g. at relatively high frequencies or at intermediate frequencies, where a particular loudspeaker unit or type of loudspeaker has a substantial deviation in its otherwise flat frequency transfer function)

An object of the present application is to provide an improve loudspeaker system.

Objects of the application are achieved by the invention described in the accompanying claims and as described in the following.

A Loudspeaker System:

In an aspect of the present application, an object of the application is achieved by a loudspeaker system comprising
a) an input unit providing an electric input audio signal;
b) an equalization unit for modifying said electric input audio signal or a processed version thereof in dependence on frequency and to provide an equalized electric audio signal according to a predefined equalization function,
c) a loudspeaker unit for converting said equalized electric audio signal or a processed version thereof to an acoustic output sound signal, and
d) a user interface for modifying a volume level of said output sound signal in a multitude of steps $V_0, V_1, \ldots, V_N$, wherein the equalization unit is configured to apply a specific equalization function $EQ_0, EQ_1, \ldots, EQ_N$ to the electric input audio signal in each of said multitude of steps $V_0, V_1, \ldots, V_N$ of the volume level.

This has the advantage of allowing an equalization to be adapted to a specific user selected volume level of the loudspeaker unit.

In an embodiment, the equalization unit is configured to provide that at least two, or a majority, or all, of said specific equalization functions $EQ_0, EQ_1, \ldots, EQ_N$ are different.

In an embodiment, the equalization unit is configured to provide that each specific equalization function defines a frequency dependent attenuation of the electric input audio signal.

In an embodiment, each specific equalization function defines a low frequency threshold frequency $f_2$, and a high frequency threshold frequency $f_3$, defining respective low, medium and high frequency regions, wherein the attenuation in the medium frequency region between said low frequency and high frequency threshold frequencies is larger than the attenuation in the low frequency region below said low frequency threshold frequency.

In an embodiment, the loudspeaker system is configured to provide
that each specific equalization function $EQ_i$, $i=0, 1, 2, \ldots, N$, is applied to the electric audio signal when the corresponding respective step $V_i$, $i=0, 1, 2, \ldots, N$, of the volume level is selected, where increasing i corresponds to increasing volume,
that each equalization function $EQ_i(f)$ represents a specific frequency dependent attenuation $EQ_i(f)$, and
that the attenuation of an equalization function $EQ_i(f)$ is smaller than the attenuation of an equalization function $EQ_j(f)$ for all frequencies in the range from an LF frequency $f_{LF}$ to a HF frequency $f_{HF}$, if i is larger than j.

In an embodiment, the LF frequency $f_{LF}$ is smaller than the low frequency threshold frequency $f_2$. In an embodiment, the HF frequency $f_{HF}$ is larger than the high frequency threshold frequency $f_3$. In an embodiment, the loudspeaker system is configured to operate in an audio frequency range between a minimum frequency $f_{min}$ and a maximum frequency $f_{max}$. In an embodiment, minimum frequency $f_{min}$ is smaller than 100 Hz, such as smaller than 50 Hz. In an embodiment, the maximum frequency $f_{max}$ is larger than 4 kHz, e.g. larger than 8 kHz. Hence, in an embodiment, $f_{min} \leq f_{LF} < f_2$, and $f_3 < f_{HF} \leq f_{max}$.

A typical loudspeaker unit has a medium frequency where a substantially flat transfer function H(f) for frequencies in the medium frequency range between first ($f_{LFcut}$) and second ($f_{HFcut}$) frequencies ($f_{LFcut} < f_{HFcut}$) can be provided. Below a low frequency cut-off frequency ($f_{LFcut}$), the frequency response of the loudspeaker unit rolls off. In other words, the loudspeaker unit will—other things being equal—play low frequency sounds (below $f_{LFcut}$) at a lower output level than sounds in the medium frequency range. The same is to a certain extent true for sound signals above a high frequency cut-off frequency ($f_{HFcut}$). These cut-off frequencies are dependent on the loudspeaker type, size, etc. In an embodiment, the low frequency cut-off frequency ($f_{LFcut}$) is smaller than 500 Hz, or smaller than 400 Hz, e.g. in the range from 200 Hz to 400 Hz. In an embodiment, the high frequency cut-off frequency ($f_{HFcut}$) is larger than 4 kHz, e.g. larger than 8 kHz, e.g. larger than 12 kHz, e.g. in the range from 4 kHz to 10 kHz.

In an embodiment, the loudspeaker system is configured to provide that the low frequency threshold frequency $f_2$ of a specific equalization function is dependent on a low frequency cut-off frequency $f_{LFcut}$ of the loudspeaker unit. In an embodiment, the low frequency threshold frequency $f_2(i)$ of each specific equalization function $EQ_i(f)$, $i=0, 1, 2, \ldots, N$, are within 50 Hz of each other, or within 25 Hz of a neighboring equalization function ($EQ_{i+1}(f)$ or $EQ_{i-1}(f)$). In an embodiment, the low frequency threshold frequency $f_2(i)$ of each specific equalization function $EQ_i(f)$, $i=0, 1, 2, \ldots, N$, are equal. In an embodiment, an average of the individual specific equalization function $EQ_i(f)$, $i=0, 1, 2, \ldots, N$, is (essentially) equal a low frequency cut-off frequency ($f_{LFcut}$) of the loudspeaker unit. In an embodiment, the low frequency threshold frequency $f_2(i)$ of each specific equalization function $EQ_i(f)$, $i=0, 1, 2, \ldots, N$, are equal and equal to the low frequency cut-off frequency ($f_{LFcut}$) of the loudspeaker unit. The same relations can be assumed to exist between $f_3(i)$ of each specific equalization function $EQ_i(f)$, $i=0, 1, 2, \ldots, N$ and the high frequency cut-off frequency ($f_{HFcut}$) of the loudspeaker unit.

In an embodiment, a specific equalization function is implemented by a filter, e.g. an IIR (Infinite Impulse response) filter, e.g. an analogue filter or a digital IIR filter. In a specific embodiment, the equalization function is implemented by a digital filter, e.g. a digital FIR (Finite Impulse Response) filter. In a preferred embodiment, the equalization function is implemented by a digital IIR filter, e.g. using one or more biquad filters (whose transfer function can be written as a ratio of two quadratic functions (a second order feed-forward and a second order feedback filter function). Various aspects of filters, in particular adaptive filters are e.g. described in [Haykin; 2001].

In an embodiment, the loudspeaker system comprises a memory wherein predefined sets of filter coefficients for implementing (e.g. approximating) specific equalization functions are stored. In an embodiment, a specific set of filter coefficients ($b_{ip}$, $a_{iq}$) corresponding to a specific equalization function $EQ_i$ is applied to the filter (e.g. a digital IIR filter) when a specific volume level $V_i$ is selected via the user interface.

In an embodiment, the multitude of steps $V_0, V_1, \ldots, V_N$ of the volume level comprises at least two steps, such as at least 3 steps ($N \geq 2$), such as at least 5 steps ($N \geq 4$), such as at least 7 steps ($N \geq 6$).

In an embodiment, the loudspeaker system is configured to operate in a fixed mode. In an embodiment, the loudspeaker system is configured to operate in two or more modes. In an embodiment, the loudspeaker system is configured to operate in two or more modes, wherein each mode has a separate set of volume dependent equalization functions.

In an embodiment, the loudspeaker system is configured to operate in at least two modes of operation, a first mode and a second mode. In an embodiment, the first mode is a full bandwidth mode, wherein a reproduction of music or other broadband audio signal (in a high quality considering the system constraints) is aimed at. In an embodiment, the second mode is a limited bandwidth mode, wherein a reproduction a speech or other limited bandwidth audio signal (e.g. a telephone signal) is aimed at. In an embodiment, a mode of operation may be defined or influenced by the current power supply (different equalization functions being e.g. defined for a relatively lower supply voltage (e.g. from a battery) than for a relatively higher supply voltage (e.g. from a mains supply or from a separate device, e.g. via an (e.g. audio) interface). In an embodiment, separate modes of operation (having their specific volume dependent equalization functions) may be defined by the currently connected type of device, a mobile telephone, a headset, a PC, etc.

In an embodiment, when the loudspeaker system is in the first, full bandwidth mode, each specific equalization function $EQ_i$, $i=0, 1, 2, \ldots, N$, decreases its attenuation from a maximum attenuation value $L(f_2)$ in the intermediate frequency range (at a low frequency threshold frequency $f_2$) to a minimum attenuation value ($L(f_1)$, e.g. equal to 0) at a first lower frequency $f_1$ ($f_1 < f_2$) (see e.g. FIG. 3). In an embodiment, the decrease in attenuation from $L(f_2)$ to $L(f_1)$ is approximately linear on a logarithmic scale. In an embodiment, the first lower frequency $f_1$ is essentially equal for all specific equalization functions $EQ_i$, $i=0, 1, 2, \ldots, N$. In an embodiment, the first lower frequency $f_1$ is different for at least some of the specific equalization functions $EQ_i$, $i=0, 1, 2, \ldots, N$.

In an embodiment, the loudspeaker system is configured to allow a current mode of operation to be changed (e.g. overriding an automatic mode selection) via the user interface. In an embodiment, the user interface comprises an activation element, e.g. a button or a selection wheel. In an embodiment, the user interface comprises a touch sensitive display. In an embodiment, the user interface is implemented in a remote control device via a communication interface. In an embodiment, the remote control device comprises a PC or a cellular phone, e.g. a SmartPhone. In an embodiment, the user interface is implemented as an APP on a SmartPhone.

In an embodiment, the loudspeaker system work under power constraints. The maximum voltage swing that can be applied to the loudspeaker unit can e.g. be limited by available power in the loudspeaker system (be it supplied by another device or a local energy source), by a maximum amplifier output, by a specifications of the loudspeaker unit (e.g. a maximum displacement restriction, and/or a maximum power input or rating). In an embodiment, the loudspeaker system is configured to work under power constraints in that the maximum voltage swing that can be applied to the loudspeaker unit is limited by one or more of the following a) the available power in the loudspeaker system, b) a maximum amplifier output, and c) specifications of the loudspeaker unit.

In an embodiment, the loudspeaker system is energized by a power source providing a limited maximum voltage swing of the audio signal being processed by the loudspeaker system (e.g. the electric input audio signal received from another device or from another part of the loudspeaker system, or the electric output audio signal fed to the loudspeaker unit). In an embodiment, the loudspeaker system is energized from another device or system (e.g. a PC or a cell phone or another entertainment device), e.g. via a cable connection, e.g. comprising a USB (Universal Serial Bus) interface (or via a wireless connection simultaneously providing power to the loudspeaker system). In an embodiment, the maximum voltage of the audio interface is smaller than or equal to 5 V. In an embodiment, the maximum draw of current via the audio interface is smaller than or equal to 500 mA. In an embodiment, the loudspeaker system comprises a local energy source, e.g. a battery, such as a rechargeable battery (e.g. a NiMH or a Li-Ion or a Li-Polymer battery) or a non-rechargeable (conventional) battery, for energizing components of the loudspeaker system for a certain amount of time. In an embodiment, a maximum voltage of the battery is smaller than 4 V.

In an embodiment, the loudspeaker unit has a maximum dimension that is smaller than or equal to 1 m, such as smaller than or equal to 0.5 m, such as smaller than or equal to 0.2 m, or smaller than or equal to 0.15 m, e.g. of the order of 0.1 m or less, e.g. in the range from 0.002 m to 0.1 m.

In an embodiment, the loudspeaker unit has a maximum power rating (peak power) indicative of the maximum power that can be applied to the loudspeaker without damage (or substantial distortion) smaller than or equal to 30 W, such as smaller than or equal to 15 W, such as smaller than or equal to 5 W, such as smaller than or equal to 2 W.

In an embodiment, the loudspeaker system comprises a (wired or wireless) audio interface to another device. In an embodiment, the loudspeaker system comprises a multitude of (wired or wireless) audio interfaces to other devices (such other devices being capable of receiving (sinking) and/or transmitting/forwarding (sourcing) audio signals. In an embodiment, 'other devices' comprise e.g. a wireless telephone (e.g. a cellphone, such as a Smartphone), a computer (e.g. a PC), a headset, a hearing instrument, etc. In an embodiment, the loudspeaker system comprises at least two (wired or wireless) audio interfaces. In an embodiment, the loudspeaker system comprises at least one wired audio interface (comprising (a cable and) an electric connector, e.g. any telephone jack, an USB connector (e.g. standard or mini or micro USB connectors), a phone connector, an audio jack connector, etc.). In an embodiment, the loudspeaker system comprises at least one wireless audio interface (e.g. based on Bluetooth, e.g. Bluetooth Low Energy, DECT, ZigBee, or other proprietary or standardized audio interfaces).

In an embodiment, the loudspeaker system comprises at least one (audio) interface to a (switched) network (e.g. to a fixed landline telephone connection to the PSTN (Public Switched Telephone Network) or to the Internet (e.g. for establishing Internet telephony based on digital packet switched VoIP connections)) capable of exchanging audio signals between the loudspeaker system and another communication device, such as at least two, such as two or more audio network interfaces. In an embodiment, the loudspeaker system is configured to be connected to a computer (e.g. a PC or tablet, e.g. via a USB interface) comprising a softphone, i.e. which is adapted to run software for establishing a telephone connection to a switched network (e.g. to the PSTN). In an embodiment, the loudspeaker system is configured to be connected to a headset or a wireless phone/cellular phone (e.g. a SmartPhone, e.g. via a phone connector (audio jack) adapted for allowing two-way exchange of audio data between the loudspeaker system and the other device for sourcing and sinking audio signals).

In an embodiment, the loudspeaker system is configured to automatically be energized by another device or system, when connected to such other device or system via an audio interface providing power. In an embodiment, the loudspeaker system is configured to automatically be energized by the local energy source when the loudspeaker system is NOT connected to a device or system via an audio interface providing power.

In an embodiment, the loudspeaker system is configured to automatically be brought in a particular mode of operation depending on the currently connected audio interfaces. In an embodiment, the loudspeaker system is configured to be brought in the second (limited band) mode of operation when a (incoming or outgoing) telephone connection via an audio interface of the loudspeaker system is detected. In an embodiment, the loudspeaker system comprises an I/O control unit adapted to monitor the currently connected interface(s) (connectors) and possibly signals of the interface(s)). In an embodiment, the loudspeaker system is configured to be brought in the first (broadband) mode of operation when NOT in the second (limited band) mode of operation. In an embodiment, the loudspeaker system is configured to allow a current mode of operation to be changed (e.g. overriding an automatic mode selection) via the user interface.

The loudspeaker unit can be of any kind, e.g. a dynamic loudspeaker (using a permanent magnet and a (voice) coil connected to a diaphragm or cone; the coil (and hence the diaphragm) is axially moving in the field from the permanent magnet when an electric current of varying polarity (AC) is applied to the coil). Other loudspeaker types, e.g. based on piezoelectric or electrostatic principles, etc., can be used. The chamber surrounding the loudspeaker unit can be open or closed. Various types of acoustic couplings (drivers and acoustic resonators and transmission paths) of the loudspeaker unit and a surrounding chamber can be used, e.g. band pass, bass reflex, horn, etc.

In an embodiment, the loudspeaker system comprises a multitude of loudspeakers, e.g. two or more.

In an embodiment, the loudspeaker system further comprises a side band compressor unit (as e.g. described in WO9318626A1) for dynamically boosting a low frequency range in dependence of the present content (e.g. energy or power spectral density) in that frequency range, e.g. so that low frequency content is amplified to a lesser extent, the larger the low frequency content at a given point in time.

In an embodiment, the loudspeaker system further comprises a loudness equalization unit configured to compensate for psychoacoustic differences in the perception of a given sound pressure level over frequency (when possible).

A Communication Device:

A communication device comprising a loudspeaker system as described above in the detailed description of embodiments, in the drawings and in the claims is furthermore provided.

In an embodiment, the communication device comprises
a first microphone signal path comprising
 a microphone unit,
 a first signal processing unit, and
 a transmitter unit
  said units being operationally connected to each other and configured to transmit a processed signal originating from an input sound picked up by the microphone, and
a second loudspeaker signal path comprising
 a receiver unit,
 a second signal processing unit, and
 a loudspeaker unit operationally
  said units being operationally connected to each other and configured to provide an acoustic sound signal originating from a signal received by the receiver unit.

Thereby a speakerphone comprising a loudspeaker system according to the present disclosure can be implemented.

In an embodiment, the communication device comprises at least one audio interface to a switched network and at least one audio interface to an audio delivery device. In an embodiment, the (one way) audio delivery device is a music player or any other entertainment device providing an audio signal. In an embodiment, the (loudspeaker system of the) communication device is configured to enter or be in the first, full bandwidth mode, when connected via the audio interface to a (one way) audio delivery device. In an embodiment, the (loudspeaker system of the) communication device is configured to enter or be in the second, limited bandwidth mode, when connected via the audio interface to a communication device for establishing a (two way) connection to another communication device via a switched network. Alternatively such changes of mod can be initiated via a user interface of the communication device.

Use:

In an further aspect, use of a loudspeaker system as described above in the detailed description of embodiments, in the drawings. In an embodiment, use in a speakerphone or a mobile (e.g. cellular) telephone (e.g. a SmartPhone) or a headset or a hearing aid is provided.

In an embodiment, the communication device is portable device, e.g. a device comprising a local energy source, e.g. a battery, e.g. a rechargeable battery. In an embodiment, the hearing assistance device is a low power device. The term 'low power device' is in the present context taken to mean a device whose energy budget is restricted, e.g. because it is a portable device, e.g. comprising an energy source, which—without being exchanged or recharged—is of limited duration (the limited duration being e.g. of the order of hours or days).

In an embodiment, the communication devices comprise an analogue-to-digital converter (ADC) to digitize an analogue input with a predefined sampling rate, e.g. 20 kHz. In an embodiment, the communication device comprise a digital-to-analogue converter (DAC) to convert a digital signal to an analogue output signal, e.g. for being presented to a user or users via an output transducer.

In an embodiment, the frequency range considered by the communication device from a minimum frequency $f_{min}$ to a maximum frequency $f_{max}$ comprises a part of the typical human audible frequency range from 20 Hz to 20 kHz, e.g. a part of the range from 20 Hz to 12 kHz.

In a particular embodiment, the communication device comprises a voice detector (VD) for determining whether or not an input signal comprises a voice signal (at a given point in time). Such detector may aid in determining an appropriate mode of operation of the loudspeaker system In an embodiment, the communication device comprises an acoustic (and/or mechanical) feedback suppression system. In an embodiment, the communication device further comprises other relevant functionality for the application in question, e.g. compression, noise reduction, etc.

In an embodiment, the communication device comprises a cellular telephone or a speakerphone. In an embodiment, the communication device comprises a listening device, e.g. an entertainment device, e.g. a music player, e.g. a hearing aid, e.g. a hearing instrument, e.g. a headset, an earphone, an ear protection device or a combination thereof.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which:

FIGS. 1A, 1B and 10 show three exemplary embodiments of a loudspeaker system according to the present disclosure.

The figures are schematic and simplified for clarity, and they just show details which are essential to the understanding of the disclosure, while other details are left out.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

Figure 1A:
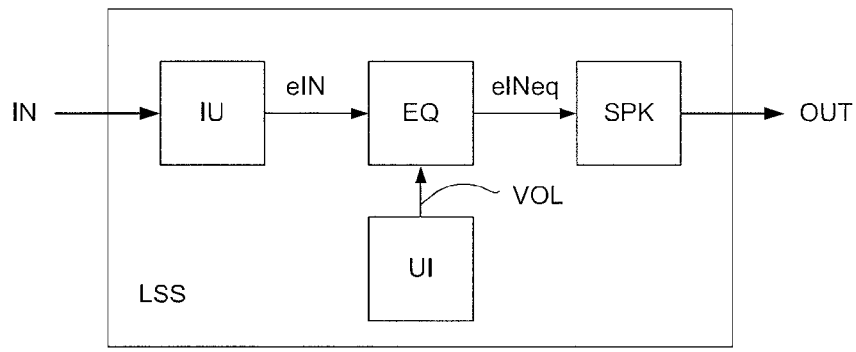
Figure 1B:
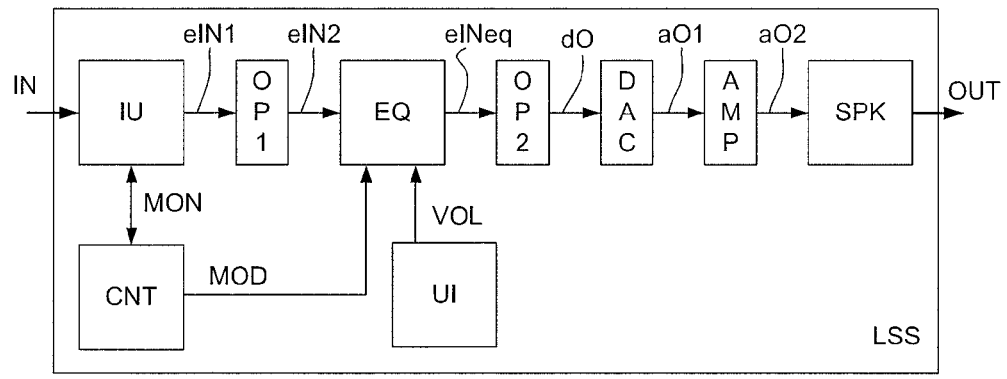

FIGS. 1A and 1B show three exemplary embodiments of a loudspeaker system LSS according to the present disclosure. FIG. 1A shows a loudspeaker system LSS an input unit IU providing an electric input audio signal eIN based on input signal IN. Input signal IN may e.g. be an acoustic signal from the environment (in which case input unit IU comprises a microphone), or an electric signal received from a component of the loudspeaker system or from another device, or a mixture thereof. The input unit IU comprises an audio interface. The input signal IN may (in case it is an electric signal) be an analogue signal (e.g. an audio signal from an audio jack interface) or a digital signal (e.g. an audio signal from a USB audio interface). The input unit IU may e.g. comprise an analogue to digital converter (ADC) to convert an analogue electric signal to a digital electric signal (using an appropriate audio sampling frequency, e.g. 20 kHz). The loudspeaker system LSS further comprises an equalization unit EQ for modifying the electric input audio signal eIN (or a processed version thereof, cf. e.g. FIG. 1B, 1C) in dependence on frequency and to provide an equalized electric audio signal eINeq according to a predefined equalization function. The equalization unit EQ is described in FIGS. 1B and 1C to work in the digital domain (cf. digital signals eIN2/eINeq/eINeq1/eINeq2). The equalization unit may, however, in an embodiment work in the analogue domain. The loudspeaker system LSS further comprises a loudspeaker unit SPK for converting the equalized electric audio signal eINeq (or a processed version thereof, cf. e.g. FIG. 1B, 1C) to an acoustic output sound signal OUT. The loudspeaker unit SPK may alternatively be a mechanical vibrator of a bone anchored hearing device. The loudspeaker system LSS further comprises a user interface for modifying a volume level of the output sound signal OUT in a multitude of steps $V_0, V_1, \ldots, V_N$, a specific step being indicated by control signal VOL. In a particular mode of operation of the loudspeaker system LSS, the equalization unit EQ is configured to apply a specific equalization function $EQ_0, EQ_1, \ldots, EQ_N$ to the electric input audio signal in each of said multitude of steps $V_0, V_1, \ldots, V_N$ of the volume level requested via the user interface UI. The loudspeaker system LSS comprises predefined equalization functions $EQ_0, EQ_1, \ldots, EQ_N$ each indicating a predefined frequency dependent gain (e.g. attenuation) to be applied to the input audio signal when a corresponding volume $V_0, V_1, \ldots, V_N$ is requested. In other words, corresponding sets of volume setting and equalization function $(V_i, EQ_i)$ is available to the loudspeaker system LSS. The loudspeaker system LSS is configured to operate in at least two modes of operation, a first mode and a second mode, wherein the first mode is a full bandwidth mode, wherein a reproduction of music or other broadband audio signal is aimed at. The full bandwidth mode is the mode that is associated with equalization curves (denoted $EQ_0$-$EQ_8$) in FIG. 4 and resulting frequency response curves (denoted $VOL_0$-$VOL_8$) in FIG. 5.

FIG. 1B illustrates a further embodiment of the loudspeaker system LSS. The embodiment of FIG. 1B contains the same elements as shown and described in connection with FIG. 1A. The embodiment of FIG. 1B further comprises an intermediate 'other' processing unit OP1 between the input unit IU and the equalization unit EQ. The processing unit OP1 is configured to provide normalization of the digital input audio signal eIN1 and to provide a normalized input audio signal eIN2. This functionality may e.g. in practice form part of the input unit IU. The digitized input audio signal eIN1 may be provided in a variety of voltage levels. The processing unit OP1 'normalizes' these voltage levels to the appropriate level of the loudspeaker system (considering its power supply voltage, component specifications, etc.). The role of the equalization unit EQ is in general to attenuate the normalized input signal to a varying degree (depending on frequency and volume level (and mode of operation)). Other processing may be included in OP1. The equalization unit EQ. receives the normalized (and optionally further processed) input audio signal and provides as an output an equalized signal eINeq (in dependence of a volume control signal VOL received from the user interface UI and of a mode control signal MOD received from control unit CNT). The control unit CNT is configured to monitor the input unit IU and based thereon to decide which mode of operation the loudspeaker system LSS is intended to operate in (e.g. based on the type of signal IN received by the input unit IU or by a control signal received via the audio interface of the input unit IU). The relevant mode is indicated by mode control signal MOD. The embodiment of FIG. 1B further comprises a further intermediate 'other' processing unit OP2, a digital to analogue converter DAC, and an amplifier unit AMP between the equalization unit EQ and the speaker unit SPK. The processing unit OP2 is configured to provide optional further processing of the equalized audio input signal eINeq (e.g. to apply digital gain, noise reduction or compression, if relevant) and to provide processed digital output signal dO. The digital to analogue converter DAC (e.g. a sigma-delta converter) converts the digital output signal dO to an analogue output signal aO1. The amplifier unit AMP amplifies analogue output signal aO1 and provides amplified analogue output signal aO2 to loudspeaker unit SPK.

Figure 1C:
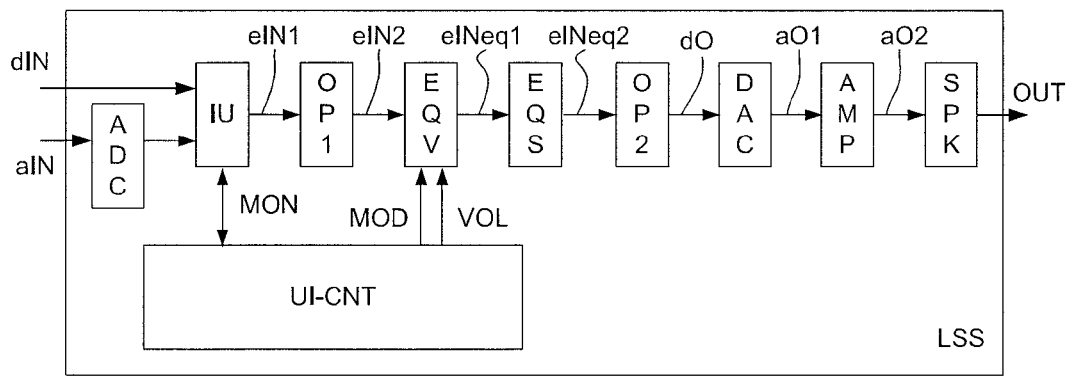

FIG. 1C illustrates a further embodiment of the loudspeaker system LSS. The embodiment of FIG. 1C contains the same elements as shown and described in connection with FIG. 1B. The embodiment of FIG. 1C illustrates an embodiment where the input unit IU comprises two different audio interfaces, a) a digital audio interface (e.g. an audio USB interface), where a digital electric input audio signal dIN can be received from another device (e.g. a computer, cf. e.g. PC in FIG. 6B), and b) an analogue audio interface (e.g. an audio jack interface), where an analogue electric input audio signal aIN can be received from another device (e.g. an entertainment device, cf. e.g. Music player in FIG. 6B). The loudspeaker system LSS further comprises an analogue to digital converter ADC to digitize the analogue electric input audio signal aIN before it enters the input unit IU. In the embodiment of FIG. 1O, the user interface and control unit (UI and CNT, respectively, of the embodiment of FIG. 1B) are integrated in user interface-control unit UI-CNT, which is configured to receive inputs from a user as well as to extract relevant information from the audio interfaces of the input unit IU, and based thereon (signal MON) to generate control signals MOD and VOL to control equalization unit EQV. The equalization unit EQ of the embodiment of FIG. 1B is in the embodiment of FIG. 1O divided into two functional units EQV and EQS. EQV provides a volume (and mode) dependent equalization of normalized input audio signal eIN2 and provides a first equalized input signal eINeq1 to 'static' equalization unit EQS. Equalization unit EQS is configured to provide an equalization of the input signal that is NOT volume dependent, i.e. which is the same for all equalization function Ea, i=0, 1, 2, ..., N. Such volume independent equalization may e.g. account for (clean up') (minor) deviations of the frequency response curve from an ideal response in the intermediate frequency range (where it is normally relatively flat). The 'static' equalization unit EQS provides a second equalized input signal eINeq2 to processing unit OP2. The order of the equalization blocks EQV and EQS may be swapped.

Figure 2A:
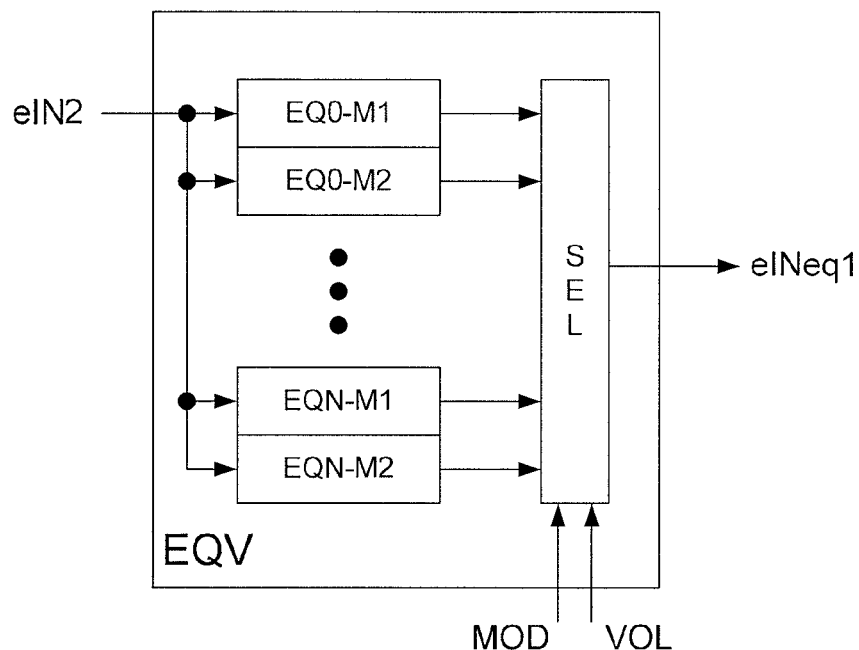
FIGS. 2A and 2B show two exemplary embodiments of an equalizer unit for a loudspeaker system according to the present disclosure, FIGS. 3A, 3B and 3C schematically illustrate various frequencies related to an equalization curve and a transfer function of a loudspeaker unit in relation to the present disclosure, FIG. 4 schematically illustrates exemplary equalization curves for different volume steps according to the present disclosure.
Figure 2B:
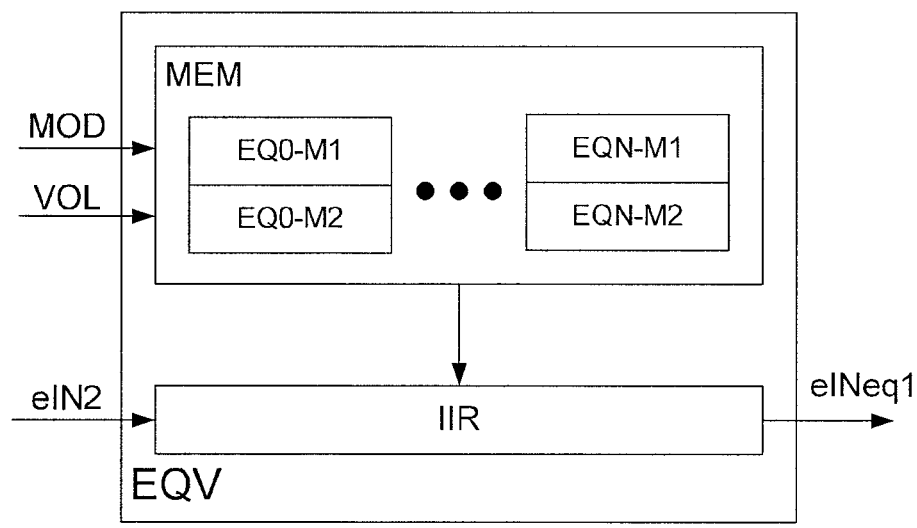

FIGS. 2A and 2B show two exemplary embodiments of an equalizer unit for a loudspeaker system according to the present disclosure. FIG. 2A shows an equalization unit EQ as discussed in connection with FIG. 1, e.g. a volume (and mode) dependent equalization unit EQV providing a first equalized input signal eINeq1 based on normalized input audio signal eIN2 as shown in FIG. 1O. The equalization units of FIG. 2 may or may not include the static part described in connection with FIG. 1c (unit EQS). FIG. 2A illustrates an embodiment of an equalization unit EQV wherein a separate path for each equalization function $(EQ_i\text{-}M_x, i=0, 1, 2, \ldots, N, \text{ and } x=1, 2$, where N+1 is the number of volume steps and 2 is the number of modes of operation (which may be 1 or larger than 2) exists and an appropriate one is chosen in selector unit SEL based on control input signals MOD (current detected or requested mode of operation) and VOL (current requested volume setting). The blocks $EQ_i\text{-}M_x$ may be implemented as separate fixed filters each working on the same input signal eIN2 and providing a unique equalization (attenuation) of the input signal depending on i, x (volume and mode), a corresponding one being selected as output eINeq1 based on control inputs MOD, VOL.

FIG. 2B illustrates an alternative implementation of the equalization unit EQ. In the embodiment of FIG. 2B, the equalization unit EQV comprises a memory storing equalization functions (e.g. in the form of filter coefficients of a variable filter) for each of the 2N equalization functions ($EQ_i$-$M_x$, i=0, 1, 2, ..., N, and x=1, 2) to be implemented by the loudspeaker system LSS in question. The normalized input audio signal eIN2 is fed to a variable filter, here a digital IIR filter, and appropriate filter coefficients are retrieved from the memory and applied to the variable filter according to the current requested volume setting and mode of operation. A resulting (first) equalized (input) signal eINeq1 is thereby provided. Other filters than a digital IIR filter may be used (e.g. a digital FIR filter or an analogue filter).

Figure 3A:
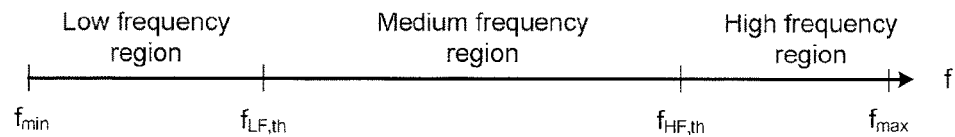
Figure 3B:
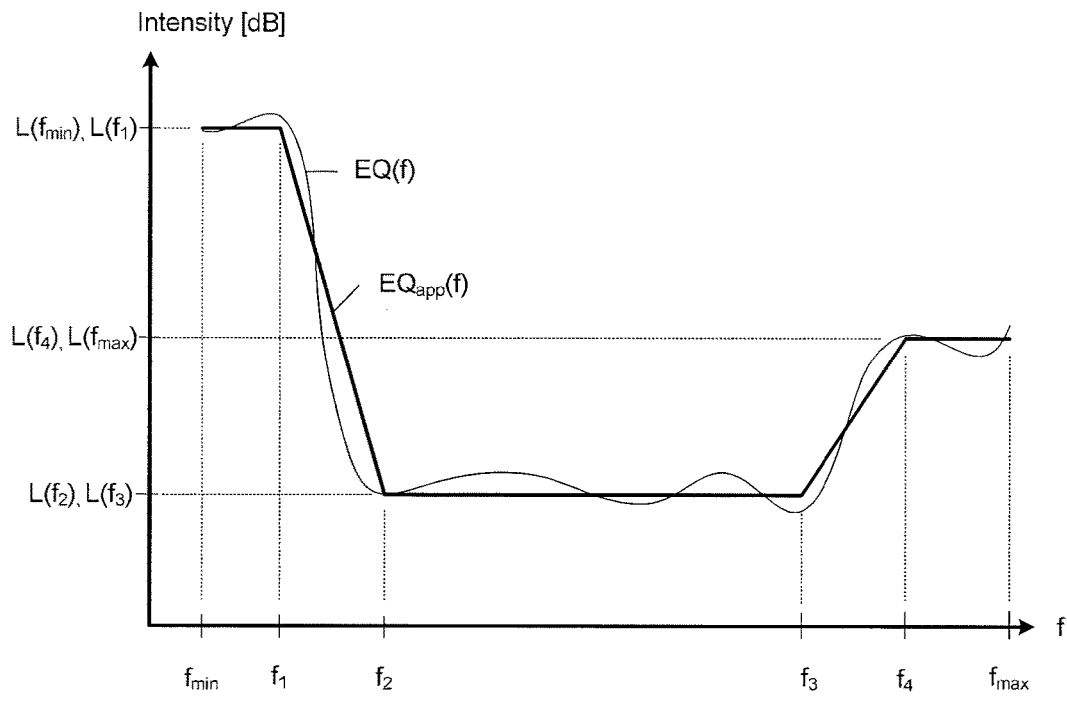
Figure 3C:
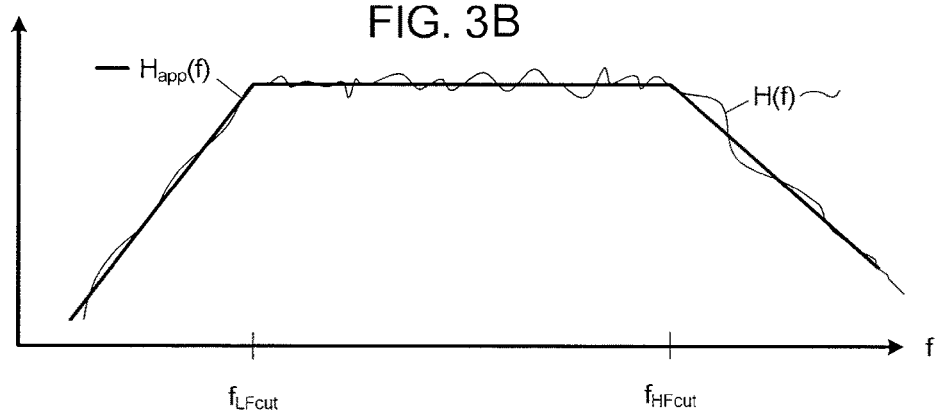

FIGS. 3A, 3B and 3C schematically illustrate various frequencies related to an equalization curve and a transfer function of a loudspeaker unit in relation to the present disclosure.

FIG. 3A illustrates a frequency range of operation of the loudspeaker system (or a communication device that it forms part of). The system is configured to operate in an audio frequency range between a minimum frequency $f_{min}$ and a maximum frequency $f_{max}$. In an embodiment, the minimum frequency $f_{min}$ is smaller than 50 Hz. In an embodiment, the maximum frequency $f_{max}$ is larger than 4 kHz, e.g. larger than 8 kHz. The frequency of operation is divided into a Low frequency region, a Medium frequency region and a High frequency region, separated by threshold frequencies $f_{LF,th}$ and $f_{LF,th}$.

FIG. 3B illustrates an exemplary (schematic) equalization curve to define relevant frequencies. The frequencies $f_2$ and $f_3$ correspond in principle to the above defined threshold frequencies $f_{LF,th}$ and $f_{LF,th}$. In the equalization functions $EQ_0$-$EQ_N$ of the present disclosure, frequencies $f_2$ and f3 may be different for different functions (and thus not be identical to the respective threshold frequencies $f_{LF,th}$ and $f_{LF,th}$), but will typically not deviate much and be close to the threshold frequencies. Frequency $f_1$ may be determined based on a subjective criterion and/or a power consumption criterion, and/or an amplifier voltage and/or a speaker displacement. Frequency $f_1$ may vary from equalization function to equalization function, and may (for some equalization functions, if possible) coincide with the minimum frequency of operation $f_{min}$. The same is the case for frequency $f_4$.

Each specific equalization function defines a low frequency threshold frequency $f_2$ ($\sim f_{LF,th}$) and a high frequency threshold frequency $f_3$ ($\sim f_{HF,th}$) defining respective low, medium and high frequency regions (for that equalization function), wherein the attenuation in the medium frequency region between said low frequency and high frequency threshold frequencies ($f_2$, $f_3$) is larger than the attenuation in the low frequency region below said low frequency threshold frequency ($f_2$). The frequency $f_1$ is smaller than the low frequency threshold frequency $f_2$. Correspondingly, the frequency $f_4$ is larger than the high frequency threshold frequency $f_3$. The loudspeaker system is configured to operate in an audio frequency range between a minimum frequency $f_{min}$ (e.g. 5-50 Hz) and a maximum frequency $f_{max}$. (e.g. 4 kHz).

The course of the equalization curves in frequency ranges $f_1$-$f_2$ and $f_3$-$f_4$ are intended to compensate for the deviation of the frequency response of the loudspeaker unit at low and high frequencies, respectively (below $f_{LFcut}$ and above $f_{HFcut}$, respectively, cf. FIG. 3C). The attenuation of the exemplary equalization function of FIG. 2B is shown to increase in the low frequency region between $f_1$ and $f_2$ from the medium frequency range level $L(f_2)$ at $f_2$ to a minimum attenuation level $L(f_1)$ at $f_1$. Correspondingly, the attenuation of the exemplary equalization function of FIG. 2B is shown to increase in the high frequency region between $f_3$ and $f_4$ from the medium frequency range level $L(f_3)$ at $f_3$ to an attenuation level $L(f_4)$ at $f_4$. In the schematic graph $EQ_{app}(f)$ the course between indicated neighboring frequencies $f_p$, $f_q$ (e.g. between $f_1$ and $f_2$) is linear. In practice, it may deviate from linearity, either deliberately, or due to finite filter sizes and non-linearities of components (as schematically indicated by graph EQ(f)).

FIG. 2C schematically illustrates a frequency transfer function (Amplitude in dB vs. frequency f) of a loudspeaker unit. A typical loudspeaker unit has a medium frequency range providing a substantially flat transfer function H(f) for frequencies in the medium frequency range between first ($f_{LFcut}$) and second ($f_{HFcut}$) frequencies ($f_{LFcut} < f_{HFcut}$)). Below a low frequency cut-off frequency ($f_{LFcut}$), the frequency response of the loudspeaker unit rolls off (e.g. ~12 dB/octave). In other words, the loudspeaker unit will—other things being equal—play low frequency sounds (below $f_{LFcut}$) at a lower output level than sounds in the medium frequency range. The same is to a certain extent true for sound signals above a high frequency cut-off frequency ($f_{HFcut}$). Depending on the loudspeaker unit in question, the low frequency cut-off frequency ($f_{LFcut}$) is smaller than 500 Hz, e.g. smaller than 400 Hz, e.g. in the range from 200 Hz to 400 Hz. Correspondingly, he high frequency cut-off frequency ($f_{HFcut}$) depends on the loudspeaker unit in question. Preferably, it is larger than 4 kHz, e.g. larger than 8 kHz, e.g. larger than 12 kHz, e.g. in the range from 4 kHz to 10 kHz. An idealized graph $H_{app}(f)$ and a (schematic) real transfer function graph H(f) are indicated in FIG. 2C. The idealized (piecewise linear) graph $H_{app}(f)$ may e.g. be the result of a pre-shaping (cf. static equalization unit EQS) of the real transfer function H(f), as discussed in connection with FIG. 10 above.

Preferably, the low frequency threshold frequency $f_2(i)$ of a specific equalization function $EQ_i$ is dependent on the low frequency cut-off frequency $f_{LFcut}$ of the loudspeaker unit. Correspondingly, the high frequency threshold frequency $f_3(i)$ of a specific equalization function $EQ_i$ is dependent on the high frequency cut-off frequency $f_{HFcut}$ of the loudspeaker unit.

It should be noted, that the present scheme of volume (and mode) dependent equalization may also be applied to other (non-ideal) deviations of a loudspeaker transfer function from ideality, e.g. a dip in the transfer function at medium frequencies.

Figure 4:
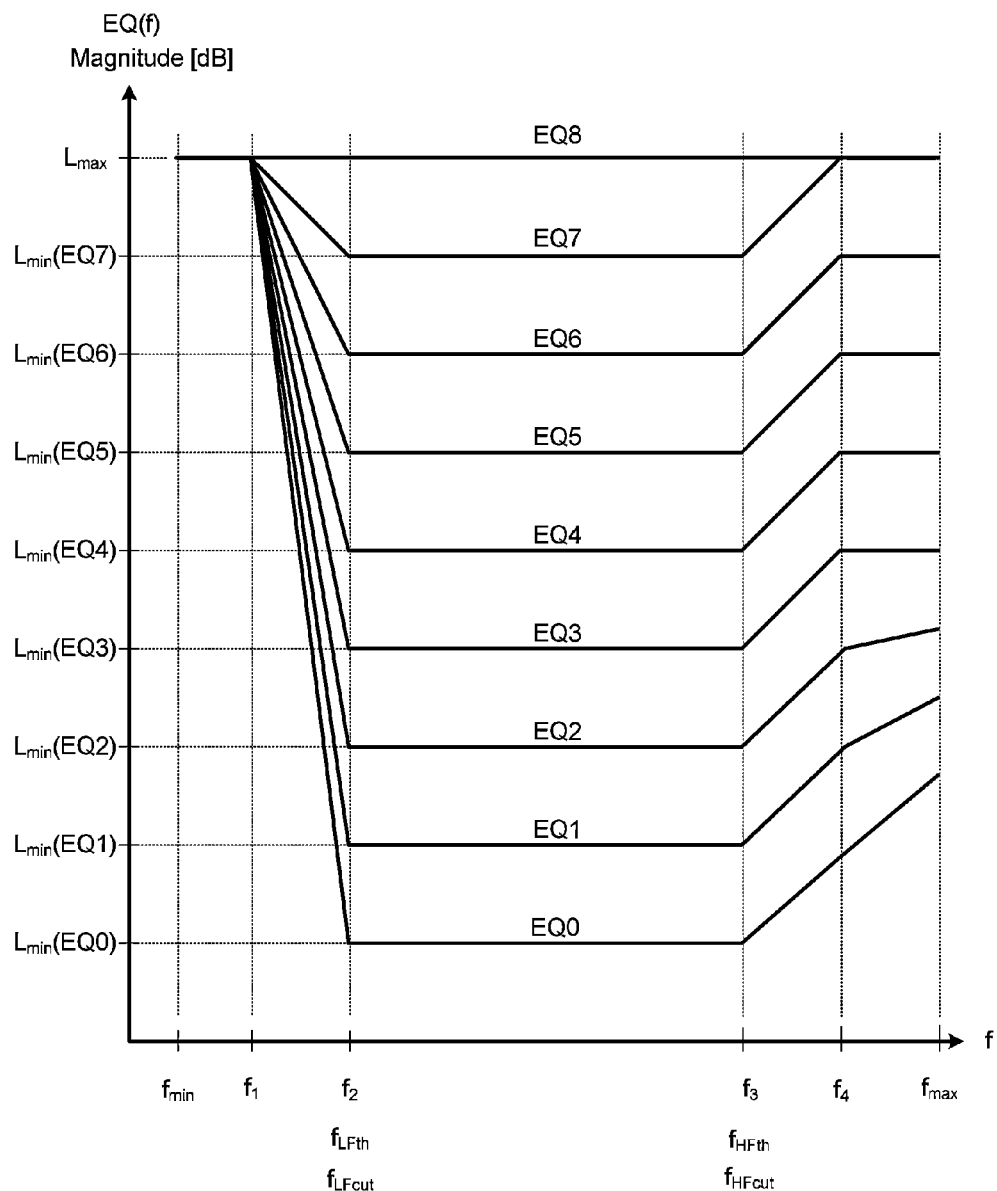

FIG. 4 shows exemplary equalization curves EQ(f) (EQ0, EQ1, ..., EQ8; here the number of volume steps is 9) versus frequency f, for different volume steps (V0, V1, ..., V8) according to the present disclosure. The equalization curves generally have the form as described in connection with FIG. 3B. The graphs show the Magnitude in dB of the attenuation at different volume levels $V_i$. The distance between two equalization curves in the intermediate range between $f_2$ and $f_3$ are indicated to be identical (indicating the same, constant step height (in dB) between individual volume steps, e.g. of the order of 3 dB or 4 dB). This need not be the case, however. The steps may vary (e.g. to decrease with increasing volume level, or vice versa) depending on the application. The (maximum) levels of attenuation (minimum levels $L_{min}(EQ_i)$) of the intermediate frequency range (between frequencies $f_2$ and $f_3$) are indicated for each equalization curve $EQ_i$ and volume step $V_i$. In the low frequency region between frequencies $f_1$ and $f_2$, the attenuation for each equalization curve EQ, decreases linearly (in a logarithmic representation) for decreasing frequencies between the respective maximum levels of attenuation ($L_{min}$ ($EQ_i$) to a minimum level of attenuation ($L_{max}$), e.g. corresponding to no attenuation (0 dB), i.e. exploiting the transfer function of the loudspeaker unit to its maximum. In an embodiment, the difference between minimum and maximum attenuation in the intermediate frequency range ($f_2$-$f_3$) is smaller than or equal to 40 dB, e.g. smaller than or equal to 30 dB. The equalization curves $EQ_i$ are generally shown to end on a constant attenuation level in the lowest and highest frequency ranges between $f_{min}$ and $f_1$ and between $f_4$ and $f_{max}$, respectively. This need not be the case however, as indicated in the high frequency region for the equalization functions $EQ_0$, $EQ_1$, $EQ_2$ corresponding to the lowest volume settings $V_0$, $V_1$, $V_2$ where the attenuation decreases (at different rates) for increasing frequency in the high frequency region between $f_4$ and $f_{max}$.

The low and high frequency threshold frequencies $f_1$ and $f_2$ are here assumed to be identical for all equalization curves, and equal the low and high frequency cut-off frequencies ($f_{LFcut}$ and $f_{HFcut}$) of the loudspeaker unit, respectively, s indicated below the frequency axis in FIG. 4. It is also indicated that the low and high frequency threshold frequencies $f_1$ and $f_2$ are identical to the respective low and high frequency threshold frequencies ($f_{LF,th}$ and $f_{HF,th}$) of the FIG. 3A defining the 3 frequency regions of the operating frequency range between a minimum $f_{min}$ and a maximum $f_{max}$ (audio) frequency of the loudspeaker system.

Figure 5:
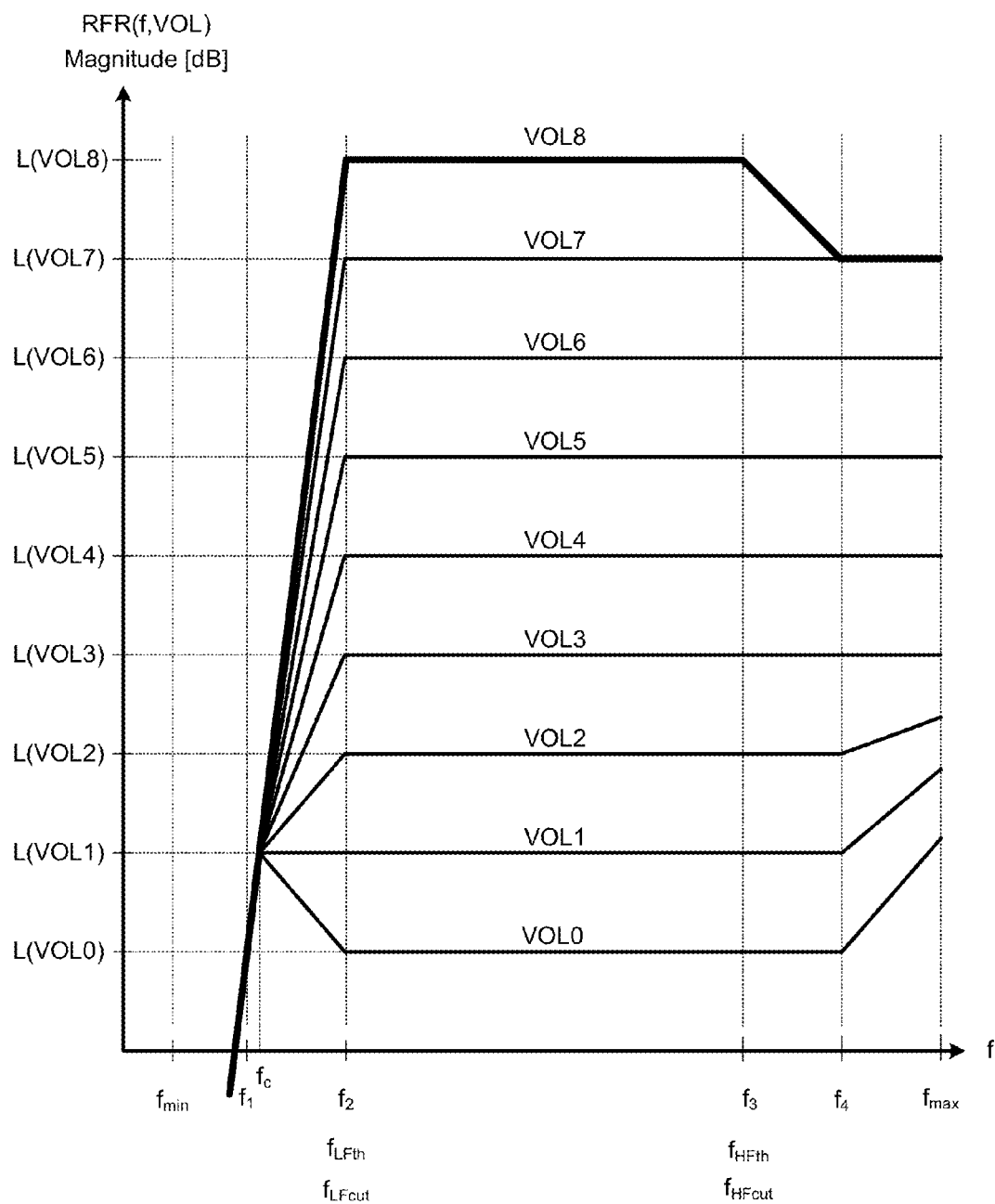
FIG. 5 shows exemplary resulting frequency response curves for a loudspeaker system according to the present disclosure.

FIG. 5 shows exemplary resulting frequency response curves RFR(f, VOL) for a loudspeaker system according to the present disclosure. The graphs schematically show Magnitude (in dB) versus frequency f for a number of volume settings $VOL_i$ (i=0, 1, . . . , 8). The resulting frequency response curves are assumed to result from the equalization curves of FIG. 4 and a frequency response curve or the loudspeaker unit (as exemplified in FIG. 3C).

The (maximum) output levels $L(VOL_i)$ of the intermediate frequency range (between frequencies $f_2$ and $f_3$) are indicated for each volume step $VOL_i$.

The volume step dependent equalizer of the present disclosure may address two issues:
Primarily: When decreasing the volume linearly over frequency one misses the opportunity to exploit the speaker capabilities fully in the low frequency (LF) region at low playback levels.
Secondarily: When decreasing the volume linearly over frequency the tonal balance is perceived changed due to well known psychoacoustic loudness effects.

The present scheme addresses mainly the first but may to some extend also address the second issue by utilizing separate EQ-curves for each volume step. This is e.g. the reason for the LF-boost in the lowest level and the HF-boost the 3 lowest volume levels, as illustrated in FIG. 5.

The upper curve ($VOL_8$) describes a flat speaker response with a LF cut off point at $f_2$ (e.g. corresponding to approximately 325 Hz). The other curves ($VOL_2$-$VOL_7$) exhibit the same course, only that the follow the decay of the curve corresponding to maximum volume (no attenuation, $VOL_8$) below a cutoff frequency $f_c$. (e.g. around 75 Hz). Alternatively, however, the cutoff point at $f_2$ may be gradually lowered in frequency with decreasing volume level until it at the lowest volume step reaches $f_c$. This can be achieved by extending the level $L(VOL_i)$ i=1-7 of the intermediate frequency region in the frequency range below $f_2$ until it reaches the boundary curve corresponding to $VOL_8$ (bold line).

At the very lowest step ($VOL_0$) an additional bass boost is applied making the response peak around $f_c$ (e.g. 75-100 Hz). This can be considered as a small loudness compensation.

To enable as loud as possible playback within the available maximum voltage swing, no high frequency boost is applied at the highest volume step (cf. FIG. 4). This boost is introduced at the second highest volume step and is kept all the way down to the lowest volume step (cf. range $f_3$-$f_4$ in FIG. 4). At the three lowest volume steps ($VOL_0$, $VOL_1$, $VOL_2$), a further, gradual HF-boost is implemented (cf. range $f_4$-$f_{max}$ in FIG. 4). This can be considered a small loudness compensation.

In an embodiment, the above scheme is implemented in the digital domain. Preferably, a full scale input is provided (by normalization). In an embodiment, no dynamic processing is used to boost small signal input levels (as e.g. proposed in WO9318626A1).

The present scheme is preferably used in a first mode of operation where music or multimedia playback is to be reproduced by the loudspeaker system (e.g. forming part of a speakerphone). A similar function can be used for playback during a second mode of operation where communication is highlighted (e.g. via a telephone line), but with different equalization functions. In general, it is anticipated that there is no substantial benefit from a bass boost in e.g. telephone conversation.

Figure 6A:
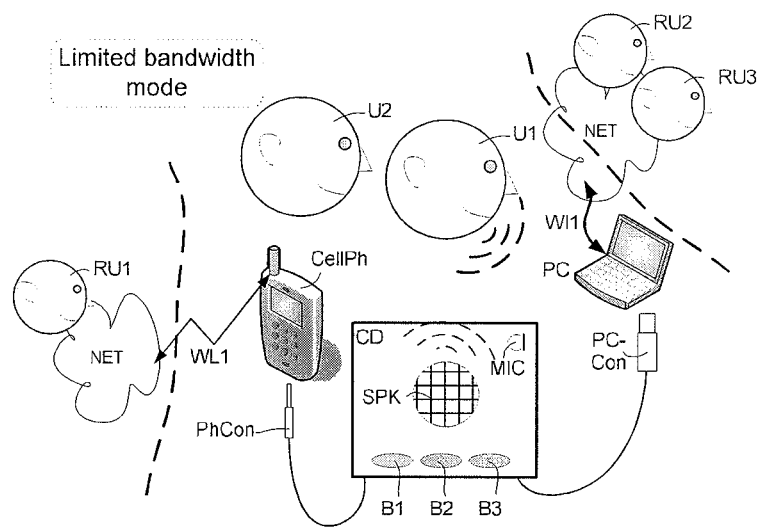
FIGS. 6A and 6B show two application scenarios of embodiment of a speakerphone comprising a loudspeaker system according to the present disclosure.
Figure 6B:
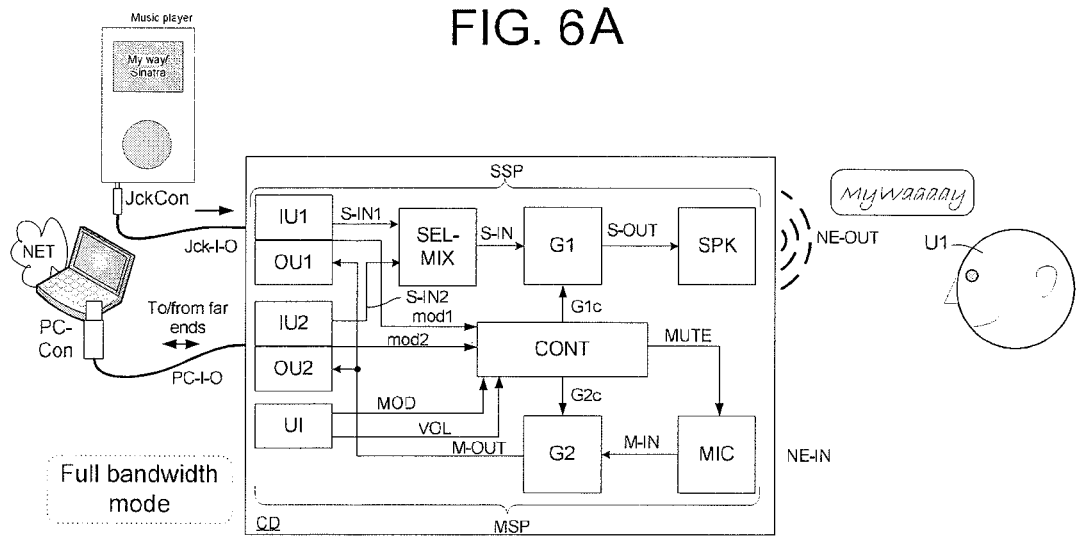

FIGS. 6A and 6B show two application scenarios of an embodiment of a communication device CD, here a speakerphone, comprising a loudspeaker system according to the present disclosure. The communication device (CD) is configured to be separately or simultaneously connected to a computer PC and a cellular telephone CellPh.

FIG. 6 shows an embodiment of a communication device (CD) comprising two wired audio interfaces to other devices, a) a wireless telephone (CellPh, e.g. a cellphone, e.g. a Smartphone, FIG. 6A) or a one-way audio delivery device (Music player in FIG. 6B), and b) a computer (PC, e.g. a PC). The audio interface to the computer (PC) comprises an USB (audio) interface including a cable and an USB-connector (PC-Con) for directly connecting the communication device to the computer and allowing two-way audio to be exchanged between the communication device CD and the computer. The audio interface to the wireless telephone (CellPh) comprises a cable and a phone connector (PhCon) for directly connecting the communication device to the computer and allowing two-way audio to be exchanged between the communication device and the computer. Preferably, the phone connector has the function of a headset connection (to transfer the audio input capability of the wireless telephone to the microphone(s) (NC) of the communication device, and to transfer the audio output of the wireless telephone to the loudspeaker(s) (SPK) of the communication device. The communication device (CD) comprises a number of activation elements (B1, B2, B3), e.g. push buttons (or alternatively a touch sensitive display) allowing the control of functions of the communication device and/or devices connected to the communication device. Preferably, one of the activation elements (e.g. B1) is configured to allow connection (hook-off, answer call) and/or dis-connection (hook-on, terminate call) of the wireless telephone (CellPh) connected to the communication device via the phone connector (PhCon). Preferably, one of the activation elements (e.g. B2) is configured to allow a user to control the volume of the loudspeaker output. Preferably, one of the activation elements (e.g. B3) is configured to allow a user to control a mode of operation of the loudspeaker system of the communication device.

The scenario shown in FIG. 6A illustrates a teleconference between users (U1, U2) in the vicinity of the communication device (CD) and users (RU1, RU2, and RU3) at two (different) remote locations. Remote user RU1 is connected to the communication device (CD) via wireless telephone (CellPh) and wireless connection WL1 to a network (NET). Remote users RU2, RU3 are connected to the communication device (CD) via computer (PC) and wired connection WI1 to a network (NET). The scenario shown in FIG. 6A corresponds to a second, Limited bandwidth mode of operation of the loudspeaker system.

FIG. 6B illustrates a slightly different scenario than FIG. 6A. FIG. 6B illustrates the reception (and optional mixing) of audio signals from the various audio delivery devices (Music player and PC) connected to the communication device (CD). The scenario shown in FIG. 6B corresponds to a first, Full bandwidth mode of operation of the loudspeaker system. The communication device (CD) comprises two (two-way) audio interfaces embodied in I/O units IU1/OU1 and IU2/OU2, respectively. T The communication device of FIG. 6B comprises a loudspeaker signal path (SSP), a microphone signal path (MSP), and a control unit (CONT) for dynamically controlling signal processing of the two signal paths. The loudspeaker signal path (SSP) comprises receiver units (IU1, IU2) for receiving an electric signal from a connected device and providing it as an electric received input signal (S-IN1, SIN2), an SSP-signal processing unit (G1) for processing (including equalizing) the electric received input signal (S-IN1, SIN2) and providing a processed output signal (S-OUT), and a loudspeaker unit (SPK) operationally connected to each other and configured to convert the processed output signal (S-OUT) to an acoustic sound signal (OS) originating from the signal received by the receiver unit (IU1, IU2). The microphone signal path (MSP) further comprises a selector-mixing unit (SEL-MIX) for selecting one of the two inputs audio signals (or mixing them) and providing a resulting signal S-IN to the SSP-signal processing unit (G1). The microphone signal path (MSP) comprises a microphone unit (MIC) for converting an acoustic input sound (IS) to an electric microphone input signal (M-IN), an MSP-signal processing unit (G2) for processing the electric microphone input signal (M-IN) and providing a processed output signal (M-OUT), and respective transmitter units (OU1, OU2) operationally connected to each other and configured to transmit the processed signal (M-OUT) originating from an input sound (IS) picked up by the microphone unit (MIC) to the connected device (if relevant possible). The control unit (CONT) is configured to dynamically control the processing of the SSP- and MSP-signal processing units (G1 and G2, respectively), including mode selection, equalization in the SSP path, and optionally muting the microphone unit (MIC) of the MSP path (via control output signals G1c G2c, and MUTE, respectively, based on control input signal MOD and VOL from the user interface UI and/or on control inputs signals mod1 and mod2 from the audio interfaces IU1/OU1, IU2/OU2, respectively).

The loudspeaker signal path (SSP) is divided in two (IU1, IU2) for receiving input signals from the respective audio devices (Music player and PC). Likewise, the microphone signal path (MSP) is divided in two (OU1, OU2) for transmitting output signals to the respective audio devices (Music player (not relevant) and PC). One-way and two-way audio connections between the communication device (units IU1, IU2 and OU1, OU2) and two the audio devices (here Music player and PC) can be established via jack connector (JckCon) and cable (Jck-I-O), and USB connector (PC-Con) and cable (PC-I-O), respectively.

Figure 7:
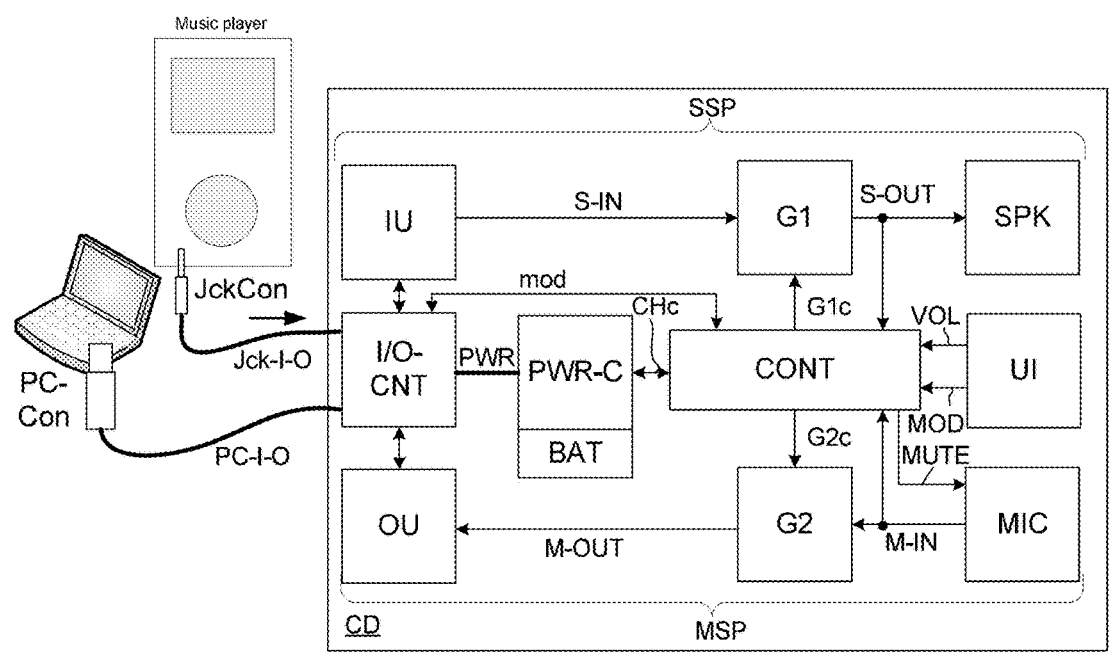
FIG. 7 shows a second embodiment of a speakerphone comprising a loudspeaker system according to the present disclosure.

FIG. 7 shows a second embodiment of a communication device CD (here a speakerphone) comprising a loudspeaker system according to the present disclosure. The unit and functionality is identical to the one described in connection with FIG. 6B (and may thus represent a relevant mode of operation, where the volume dependent equalization according to the present disclosure is advantageously applied). In the embodiment of FIG. 7, the audio interfaces are included in I/O control unit I/O-CNT, which receives input signals from the devices connected to the respective audio interfaces and transmit an output signal to the connected devices, if relevant. In a listening mode, where music or other broadband audio signals are received from one or both audio delivery devices (Music player, and PC), it is assumed that, no audio signal is transmitted from the communication device (CD) to the connected audio delivery devices. The listening mode may hence be equal to the previously discussed 'full bandwidth mode'. The I/O control unit I/O-CNT, is connected to power control unit PWR-C and a battery BAT. The power control unit PWR-C receives signal PWR from the I/O control unit I/O-CNT enabling a detection of a possible power supply signal from the audio interface and—if such power supply is present—to initiate a recharging of a rechargeable battery (BAT), if relevant. It further provides control signal CHc to the control unit indicating whether the current power supply is based on a remote source (e.g. received via the audio interface or via a mains supply) or whether the local energy source (BAT) is currently used. Such information can be used in the control unit CONT to decide on an appropriate mode of operation in general, but also regarding the volume dependent equalization. A specific set of volume dependent equalization functions for a battery mode and for an external power supply mode may be defined and the appropriate sets of parameters (e.g. filter coefficients, cf. FIG. 2B) for implementing the respective equalization functions may be stored in the communication device.

Figure 8A:
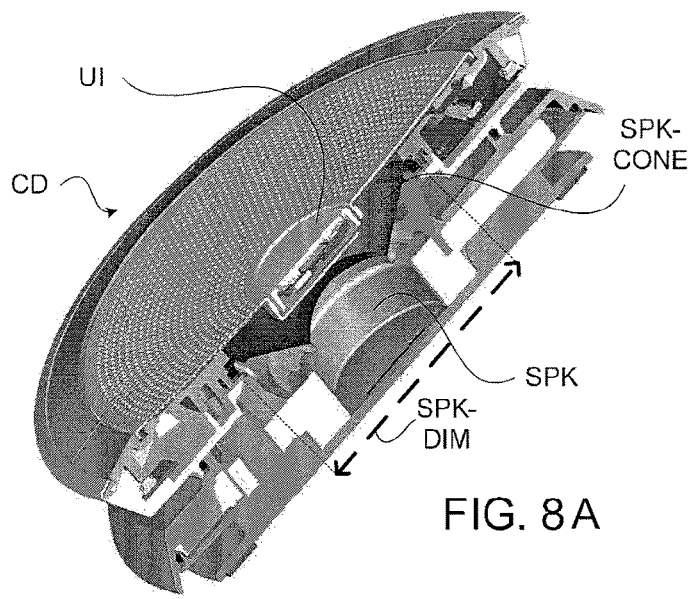
FIGS. 8A and 8B show cross-sections of a speaker phone that may advantageously include a loudspeaker system according to the present disclosure.
Figure 8B:
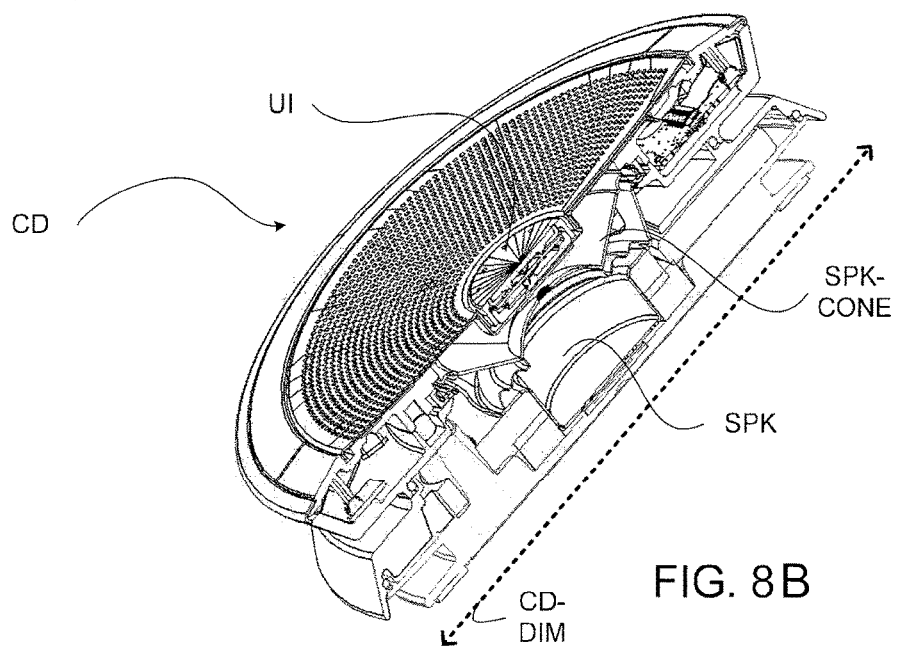

FIGS. 8A and 8B (perspective) cross-sections of a speaker phone (CD) that may advantageously include a loudspeaker system according to the present disclosure. FIGS. 8A and 8B are identical apart from FIG. 8A being a shaded version and FIG. 8B a line drawing. The speaker phone comprises a centrally located loudspeaker unit (SPK) having a speaker cone (SPK-CON) of diameter SPK-DIM, cf. FIG. 8A. The speaker diameter can have any size appropriate for the application in question. Preferably, the diameter is smaller than 1 m. In a speakerphone as depicted in FIG. 8, a diameter of less than 0.2 m, such as less than 0.15 m is relevant. The maximum dimension of the communication device (CD, here speaker phone) in FIG. 8 is termed CD-DIM (cf. FIG. 8B). In a speakerphone as depicted in FIG. 8, a maximum device dimension of less than 0.4 m, such as less than 0.25 m is relevant. The communication device comprises a user interface UI in the form of a centrally located activation element (push button), e.g. for changing a mode of operation of the device (or for activating an on or an off state, etc.)

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims and equivalents thereof.

REFERENCES

[Haykin; 2001] S. Haykin, Adaptive filter theory (Fourth Edition), Prentice Hall International Inc., 2001.
WO9318626A1

The invention claimed is:

1. A loudspeaker system, comprising:
   an input unit providing an electric input audio signal;
   an equalization unit for modifying said electric input audio signal or a processed version thereof in dependence on frequency and to provide an equalized electric audio signal according to a predefined equalization function;
   a loudspeaker unit for converting said equalized electric audio signal or a processed version thereof to an acoustic output sound signal;
   a user interface for modifying a volume level of said output sound signal in a multitude of steps $V_0$, $V_1, \ldots, V_N$; and
   an I/O control unit configured to monitor a connected interface to the loudspeaker system, wherein
   the equalization unit is configured to apply a specific predefined static equalization function $EQ_0$, $EQ_1, \ldots, EQ_N$ to the electric input audio signal in each of said multitude of steps $V_0, V_1, \ldots, V_N$ of the volume level,
   each predefined static equalization function $EQ_0$, $EQ_1, \ldots, EQ_N$ indicates a predefined frequency dependent gain to be applied to the audio signal when a corresponding volume $V_0, V_1, \ldots, V_N$ is selected,
   the loudspeaker system is configured to operate in at least two modes of operation, a first mode operating in a full bandwidth and a second mode operating in a limited bandwidth, and
   the loudspeaker system is further configured to automatically be brought in to either the first or second mode depending on the monitored interface.

2. A loudspeaker system according to claim 1 wherein the equalization unit is configured to provide that at least two of said specific equalization functions $EQ_0, EQ_1, \ldots, EQ_N$ are different.

3. A loudspeaker system according to claim 1 wherein the equalization unit is configured to provide that each specific equalization function defines a frequency dependent attenuation of the electric input audio signal.

4. A loudspeaker system according to claim 1 wherein each specific equalization function defines a low frequency threshold frequency $f_2$, and a high frequency threshold frequency $f_3$, defining respective low, medium and high frequency regions, wherein the attenuation in the medium frequency region between said low frequency and high frequency threshold frequencies is larger than the attenuation in the low frequency region below said low frequency threshold frequency.

5. A loudspeaker system according to claim 1, further configured to provide:
   that each specific equalization function $EQ_i$, i=0, 1, 2, ..., N, is applied to electric audio signal when the corresponding respective step $V_i$, i=0, 1, 2, ..., N, of the volume level is selected, where increasing i corresponds to increasing volume,
   that each equalization function $EQ_i(f)$ represents a specific frequency dependent attenuation $EQ_i(f)$, and that the attenuation of an equalization function $EQ_i(f)$ is smaller than the attenuation of an equalization function $EQ_j(f)$ for all frequencies in the range from an LF frequency $f_{LF}$ to a HF frequency $f_{HF}$, if i is larger than j.

6. A loudspeaker system according to claim 4 configured to provide that the low frequency threshold frequency $f_2$ of a specific equalization function is dependent on a low frequency cut-off frequency $f_{LFcut}$ of the loudspeaker unit.

7. A loudspeaker system according to claim 1 wherein a specific equalization function is implemented by a filter.

8. A loudspeaker system according to claim 7 comprising a memory wherein predefined sets of filter coefficients for implementing specific equalization functions are stored.

9. A loudspeaker system according to claim 1 configured to work under power constraints in that the maximum voltage swing that can be applied to the loudspeaker unit is limited by one or more of the following a) the available power in the loudspeaker system, b) a maximum amplifier output, and c) specifications of the loudspeaker unit.

10. A loudspeaker system according to claim 1, wherein the loudspeaker unit has a maximum dimension that is smaller than or equal to 1 m.

11. A loudspeaker system according to claim 1 comprising a wired or wireless audio interface to another device.

12. A loudspeaker system according to claim 1 configured to automatically be energized by another device or system, when connected to such other device or system via an audio interface providing power.

13. A loudspeaker system according to claim 1 configured to automatically be brought in a particular mode of operation depending on the currently connected audio interfaces.

14. A communication device comprising a loudspeaker system according to claim 1.

15. A communication device according to claim 14, further comprising:
    a first microphone signal path including
       a microphone unit,
       a first signal processing unit, and
       a transmitter unit,
    said microphone unit, first signal processing unit, and transmitter unit being operationally connected to each other and configured to transmit a processed signal originating from an input sound picked up by the microphone, and
    a second loudspeaker signal path including
       a receiver unit,
       a second signal processing unit, and
       a second loudspeaker unit,
    said receiver unit, second signal processing unit, and second loudspeaker unit being operationally connected to each other and configured to provide an acoustic sound signal originating from a signal received by the receiver unit.

16. A communication device according to claim 14 comprising at least one audio interface to a switched network and at least one audio interface to an audio delivery device.

17. A speakerphone, comprising a loudspeaker system that includes
    an input unit providing an electric input audio signal;
    an equalization unit for modifying said electric input audio signal or a processed version thereof in dependence on frequency and to provide an equalized electric audio signal according to a predefined equalization function;

a loudspeaker unit for converting said equalized electric audio signal or a processed version thereof to an acoustic output sound signal; and a user interface for modifying a volume level of said output sound signal in a multitude of steps $V_0, V_1, \ldots, V_N$; and an I/O control unit configured to monitor a connected interface to the loudspeaker, wherein the equalization unit is configured to apply a specific predefined static equalization function $EQ_0, EQ_1, \ldots, EQ_N$ to the electric input audio signal in each of said multitude of steps $V_0, V_1, \ldots, V_N$ of the volume level, each predefined static equalization function $EQ_0, EQ_1, \ldots, EQ_N$ indicates a predefined frequency dependent gain to be applied to the audio signal when a corresponding volume $V_0, V_1, \ldots, V_N$ is selected, the loudspeaker system is configured to operate in at least two modes of operation, a first mode operating in a full bandwidth and a second mode operating in a limited bandwidth, and the loudspeaker system is further configured to automatically be brought in to either the first or second mode depending on the monitored interface.

\* \* \* \* \*